United States Patent [19]

El Ayat et al.

[11] Patent Number: 5,528,600
[45] Date of Patent: Jun. 18, 1996

[54] TESTABILITY CIRCUITS FOR LOGIC ARRAYS

[75] Inventors: Khaled El Ayat, Cupertino; King W. Chan, Los Altos; Theodore M. Speers, San Leandro, all of Calif.

[73] Assignee: Actel Corporation, Sunnyvale, Calif.

[21] Appl. No.: 158,977

[22] Filed: Nov. 30, 1993

Related U.S. Application Data

[62] Division of Ser. No. 919,619, Jul. 24, 1992, abandoned, which is a continuation of Ser. No. 646,268, Jan. 28, 1991, abandoned.

[51] Int. Cl.$^6$ ............................ G11C 11/40; G01R 31/28
[52] U.S. Cl. ...................... 371/22.1; 371/22.3; 371/22.6; 326/16; 326/40; 365/200; 324/158.1
[58] Field of Search ............................ 371/15.1, 22.5, 371/22.3, 22.1, 25, 22.2, 38, 22.6, 23; 307/465; 324/765; 364/550; 326/16, 40, 39; 365/200, 201, 154

[56] References Cited

U.S. PATENT DOCUMENTS

| | | | |
|---|---|---|---|
| 3,995,215 | 11/1976 | Chu et al. | 324/158 R |
| 4,255,748 | 3/1981 | Bartlett | 340/661 |
| 4,357,703 | 11/1982 | Van Brunt | 371/15 |
| 4,418,403 | 11/1983 | O'Toole et al. | 365/201 |
| 4,435,805 | 3/1984 | Hsieh et al. | 371/25 |
| 4,476,560 | 10/1984 | Miller et al. | 371/15 |
| 4,525,714 | 6/1985 | Still et al. | 340/825.83 |
| 4,583,179 | 4/1986 | Horii et al. | 364/483 |
| 4,613,970 | 9/1986 | Masuda et al. | 371/25 |
| 4,625,313 | 11/1986 | Springer | 371/20 |
| 4,669,061 | 5/1987 | Bhavsar | 365/154 |
| 4,672,610 | 6/1987 | Salick | 371/27 |
| 4,701,921 | 10/1987 | Powell et al. | 371/25 |
| 4,701,922 | 10/1987 | Kuboki et al. | 371/25 |
| 4,703,484 | 10/1987 | Rolfe et al. | 371/25 |
| 4,710,933 | 12/1987 | Powell et al. | 371/25 OR |
| 4,749,947 | 6/1988 | Gheewala | 324/73 R |
| 4,752,729 | 7/1988 | Jackson et al. | 324/73 R |
| 4,758,745 | 7/1988 | Elgamal et al. | 307/465 |
| 4,764,926 | 8/1988 | Knight et al. | 371/25 |
| 4,768,196 | 8/1988 | Jou et al. | 371/25 |
| 4,816,757 | 3/1989 | Hutchins | 324/158 |
| 4,857,774 | 8/1989 | El Ayat et al. | 307/465 |
| 4,878,209 | 10/1989 | Bassett et al. | 368/113 |
| 4,912,709 | 3/1990 | Teske et al. | 371/22.1 |
| 4,926,425 | 5/1990 | Hedtke et al. | 371/22.6 |
| 4,931,722 | 6/1990 | Stoica | 371/22.5 |
| 4,947,395 | 8/1990 | Bullinger et al. | 371/22.3 |
| 5,012,135 | 4/1991 | Kaplinsky | 307/465 |
| 5,032,783 | 7/1991 | Hwang et al. | 324/73.1 OR |
| 5,043,985 | 8/1991 | Lin et al. | 371/22.3 |
| 5,043,986 | 8/1991 | Agrawal et al. | 371/25.1 |
| 5,047,710 | 9/1991 | Mahoney | 324/158 R |
| 5,054,024 | 10/1991 | Whetsel | 371/22.3 OR |
| 5,065,090 | 11/1991 | Gheewala | 324/158 |
| 5,068,605 | 11/1991 | Yasunaga et al. | 324/158 R |
| 5,072,175 | 12/1991 | Marek | 324/158 R |
| 5,074,710 | 9/1991 | Mahoney | 324/158 |
| 5,083,083 | 1/1992 | El Ayat et al. | 324/158 R |
| 5,130,647 | 7/1992 | Sakashita et al. | 324/73.1 X |
| 5,155,432 | 10/1992 | Mahoney | 324/158 R |
| 5,221,865 | 6/1993 | Phillips et al. | 307/465 |
| 5,223,792 | 6/1993 | El Ayat et al. | 324/158 R |
| 5,349,248 | 9/1994 | Parlour et al. | 307/465 |

*Primary Examiner*—Emanuel T. Voeltz
*Assistant Examiner*—Kamini S. Shah
*Attorney, Agent, or Firm*—D'Alessandro & Ritchie

[57] ABSTRACT

A circuit for providing 100% observability and controllability of inputs and outputs of any function circuit module in an array of function circuit modules includes circuitry for placing a test data bit into a selected one of any of the function circuit modules, and circuitry for reading the output of a selected one of any of the function circuit modules.

6 Claims, 6 Drawing Sheets

TESTABILITY CIRCUITS FOR LOGIC ARRAYS

RELATED APPLICATIONS

This application is division of application Ser. No. 07/919,619, filed Jul. 24, 1992, now abandoned, which is a file wrapper continuation of prior application Ser. No. 07/646,268, filed Jan. 28, 1991 now abandoned.

BACKGROUND OF THE INVENTION

1. Field Of The Invention

The present invention relates to integrated circuits. More specifically, the present invention relates to the verification and testing of integrated circuits, such as mask programmable and user programmable gate array integrated circuits.

2. The Prior Art

Numerous types of integrated circuits include a plurality of functional circuit blocks which may be connected together in a custom fashion for particular applications by providing custom interconnect wiring. This custom interconnect wiring is usually implemented in one or more interconnect layers of the integrated circuit as is well known in the art by providing a custom mask for one or more layers of the integrated circuit.

One familiar class of such circuits is known as mask programmable gate array integrated circuits. A particular circuit design is typically first prototyped using a field programmable (i.e., user programmable) gate array integrated circuit. After the circuit design has been verified and tested using the field programmable array as a vehicle, a "hardwired" mask-programmed version of the circuit is used for volume production to achieve cost reduction benefits.

Before an integrated circuit is placed into volume production, the circuit design must be verified and tested to assure complete functionality, quality, and absence of manufacturing defects. One of the difficulties in verifying designs and testing design functionality on integrated circuits is the difficulty with generating test vectors to test the integrated circuit with high fault coverage. A part of this problem is the inability to fully probe the internal circuit nodes of the chip which are not accessible via the input and output pins of the chip. It would be useful to be able to fully probe the internal nodes of an integrated circuit chip for the purposes of both design verification and functionality testing.

The concern over the ability to completely verify and test a design which has been implemented in a mask-programmed gate array integrated circuit, as well as other similar circuits, has led to numerous verification and testing solutions which are known and used in the art. According to one prior art verification and testing method, the designer develops a series of conventional functional test vectors which are applied to the inputs of the integrated circuit. The behavior of the outputs of the circuit under these test vector input conditions is then observed.

There are several problems with this approach. First, developing a comprehensive set of test vectors requires a significant amount of expertise and is extremely time consuming. In addition, the use of test vectors cannot provide 100% fault coverage, no matter how well they are crafted. Functional test vectors typically provide only about 70% fault coverage for integrated circuits of any appreciable size and complexity. Full functionality of the integrated circuit cannot be guaranteed with such incomplete fault coverage.

Another prior art technique which has been developed is known as automatic test pattern generation ATPG. Algorithms, usually implemented in software programs, are used for generating a specialized set of test vectors. All ATPG schemes require the addition to the integrated circuit of circuitry not used during the normal functioning of the circuit. Use of ATPG techniques can raise fault coverage to over 90%.

One form of ATPG verification and testing scheme utilizes scanning techniques. A scanning verification and test regime utilizes special hardware included on the integrated circuit chip in addition to the functional circuit on the chip. A multistage serial shift register (scan register) or series of daisy chained flip-flop circuits are included on the chip, and have inputs connected to various selected internal circuit nodes on the chip. By clocking a selected serial bit stream into the chip through its input pins and the scan register, the logic states of selected internal circuit nodes may be controlled. In addition, the logic states of selected internal circuit nodes may be observed by extracting the logic states from various internal circuit nodes.

Another verification and test scheme provides an addressable matrix on the integrated circuit, through which the state of selected internal nodes of the circuit may be observed. One such scheme is disclosed in U.S. Pat. No. 4,857,774 to El Ayat et al. Another such scheme is disclosed in U.S. Pat. No. 4,749,947 to Gheewala. While these known addressable matrix techniques may provide up to 100% observability for a given hardwired integrated circuit design, they do not provide for any degree of controllability of internal circuit nodes in integrated circuits.

Currently used ATPG schemes require the circuit designer to analyze the circuit in detail to determine where additional test circuitry is needed. This analysis must be performed prior to implementation of the design in silicon.

An ideal verification and testing scheme for integrated circuits would provide both 100% observability and 100% controllability of internal integrated circuit nodes. Such a scheme would allow for automatic test pattern generation which would provide for 100% fault coverage.

It is an object of the present invention to provide a technique and a circuit, which may be integrated along with the functional circuitry of both hardwired and user programmable integrated circuits, for allowing 100% controllability and 100% observability of internal nodes comprising the inputs and outputs of functional circuit blocks in such an integrated circuit, which allows for automatic test pattern generation for 100% fault coverage of the integrated circuit.

Another object of the present invention is to eliminate testing issues from the critical path of the design cycle of integrated circuits by incorporating additional test circuitry into each functional circuit block of the integrated circuit.

BRIEF DESCRIPTION OF THE INVENTION

In the two embodiments of the invention disclosed herein, an addressable matrix is provided which allows 100% observability of the output nodes of the functional circuit blocks of the integrated circuit incorporating the present invention. In addition, a first aspect of the present invention incorporates circuitry into the functional circuit blocks which allows the output node of the functional circuit block to be controlled (independently set to a logic high or logic low level) any time that a sequential logic (storage) element is implemented by either one functional circuit block or a network of more than one functional circuit block. This circuitry, when combined with the ability to control the external logic inputs to the integrated circuit, results in indirect control of all combinatorial circuit elements. The controllability and observability features of the first aspect of the invention are used in conjunction with conventional pin-to pin testing techniques (i.e., control the inputs, read the outputs, and compare with an expected result).

In a second aspect of the invention, circuitry is incorporated in the functional circuit block which allows the output node of the block to be controlled regardless of whether the block is configured as a sequential or combinatorial circuit element. The output node of the functional circuit block may be disconnected from its inputs, allowing control of the output node regardless of the states of the inputs and regardless of whether a combinatorial or sequential element has been implemented by the block. The controllability and observability features of the second aspect of the invention may be used exclusively, without any need for pin-to-pin testing. Each functional circuit block may be tested independently with predetermined test patterns which test the function block with 100% fault coverage, permitting circuit design to proceed without the need to consider fault analysis issues.

According to the first aspect of the present invention, 100% observability and controllability of internal nodes comprising the inputs and outputs of a plurality of connected functional circuit modules in a hardwired or user-programmed logic array integrated circuit includes a data input line common to all of the functional circuit modules, means for addressing a selected one of the functional circuit modules to allow data to be presented to a test input node to control that node in the selected module, means for retaining a data test bit in the function modules, means for addressing of selected function modules to allow specific data to be presented to test input nodes to control these nodes in the selected modules, and means for reading the output node of the selected module to observe that node.

BRIEF DESCRIPTION OF THE DRAWINGS

FIG. 4b is a schematic diagram of illustrative circuitry for implementing the circuit shown in FIG. 4a.

DETAILED DESCRIPTION OF A PREFERRED EMBODIMENT

Figure 1:
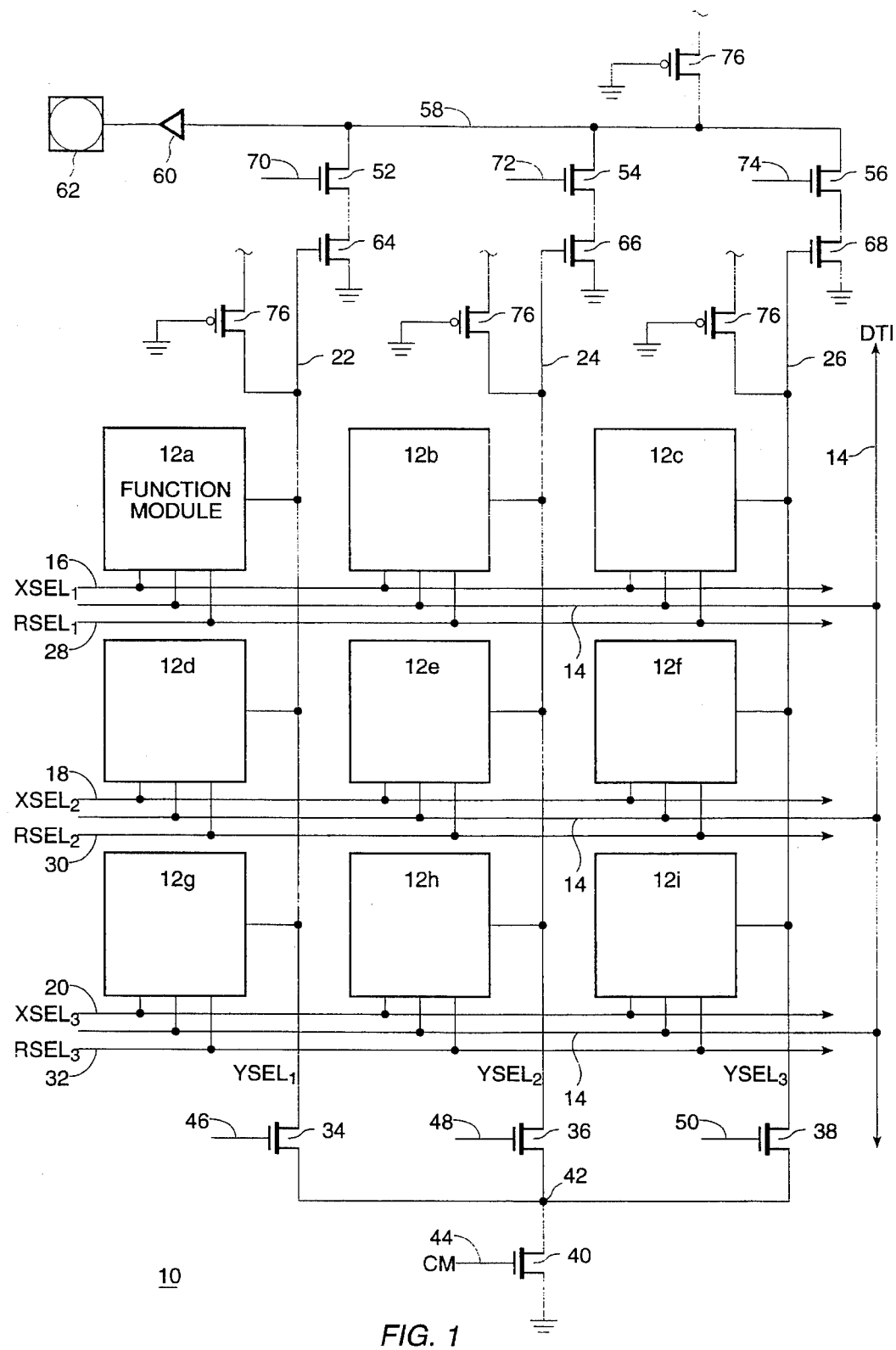
FIG. 1 is a block diagram of a circuit for providing 100% controllability and observability of function circuit modules in a logic array integrated circuit according to a first embodiment of the present invention.

Referring first to FIG. 1, a block diagram of a circuit for providing 100% controllability and observability of function circuit modules in a logic array integrated circuit according to a first embodiment of the present invention, an array 10 of function circuit modules 12a–12i is shown. Array 10 may be conceptually arranged as a plurality of rows and columns wherein modules 12a, 12b, and 12c form a first row; modules 12d, 12e, and 12f form a second row; and modules 12g, 12h, and 12i form a third row. Similarly, modules 12a, 12d, and 12g form a first column; modules 12b, 12e, and 12h form a second column; and modules 12c, 12f, and 12i form a third column.

While the array of FIG. 1 contains nine such modules for purposes of illustrating the present invention, those of ordinary skill in the art will recognize that, in a practical embodiment fabricated according to the principles disclosed herein, an array may have hundreds or thousands of such modules.

Function circuit modules 12a–12i may be configured from a wide range of circuits, including, but not limited to, hardwired integrated circuits and user-configurable logic modules of all types and description. For example, logic modules 12a–12i may be similar to those described in U.S. Pat. No. 4,758,745 to El Gamal et al., and 4,910,417 to El Gamal et al., although those of ordinary skill in the art will readily be able to utilize other function circuit modules in the present invention. Function modules 12a–12i will each have one or more inputs and at least one output (not shown in FIG. 1) for use in performing the functions assigned to the module and the overall circuit of which it is made a part. The overall circuit is realized by use of interconnections such as one or more hardwired metal interconnect layers formed by masking steps, or one of a number of available user programming techniques, such as antifuses or reconfigurable interconnect elements.

In addition, for purposes of carrying out the functions provided by the present invention, each function module 12a–12i may be equipped with other inputs, outputs and circuit elements. These structures and features will be described with reference to the accompanying figures.

The first function carried out by the present invention is a control function implemented by the loading of a selected data test bit into a selected one of the function modules. In a presently preferred embodiment of the invention, the data test bit is presented to each of the modules 12a–12i via a common data test bit input (DTI) line 14. In other embodiments of the present invention, DTI line 14 may be separated into more than one line for routing or other design convenience.

According to a presently preferred embodiment of the invention, a function module whose output is to be controlled is selected by addressing the selected module via an X select line (XSEL) and a Y select line (YSEL). There is one XSEL line associated with each row of function modules in array 10. XSEL$_1$ line 16 is associated with the first row of the array, XSEL$_2$ line 18 is associated with the second row of the array, and XSEL$_3$ line 20 is associated with the third row of the array. Similarly, there is one YSEL line associated with each column of function modules in array 10. YSEL$_1$ line 22 is associated with the first column of the array, YSEL$_2$ line 24 is associated with the second column of the array, and YSEL$_3$ line 26 is associated with the third column of the array.

In the embodiment illustrated in FIG. 1, a particular function module to be controlled may be selected by activating its associated XSEL and YSEL lines. In the embodiment illustrated in FIG. 1, the XSEL and YSEL lines are active low logic level control lines, although those of ordinary skill in the art recognize that the active logic level for the control lines is somewhat arbitrary.

As an example of function module selection, function module 12e is selected when XSEL₂ line 18 and YSEL₂ line 24 are activated. In a presently preferred embodiment of the invention, when a particular XSEL and a particular YSEL line are activated (brought low), the data test bit which is present on DTI line 14 will be placed into the selected function module at an internal test bit node.

YSEL lines 22, 24 and 26 are controlled by transistors 34, 36, 38, and 40. Transistor 34 is connected between YSEL₁ line and node 42. Transistor 36 is connected between YSEL₂ line and node 42. Transistor 38 is connected between YSEL₃ line and node 42. The gates of transistors 34, 36, and 38 are connected to column address lines 46, 48, and 50.

Transistor 40 is connected between node 42 and a fixed voltage source, such as ground. The gate of transistor 40 is controlled by a master CM signal on line 44.

The selection of which YSEL line for controllability is achieved in the embodiment shown in FIG. 1 by activating the one of column address lines 46, 48, or 50 associated with the selected column, and simultaneously activating CM line 44. The selected YSEL line will be brought low.

The XSEL and YSEL lines are preferably activated from the periphery of the circuit by well known selection circuitry, such as a conventional one-of-n decoder or shift register. DTI line 14 may be controlled from off chip or internally by conventional circuitry. Since only one function module needs to be set at a time, DTI may be a global signal shared by all function modules. The control operation for function module 12 according to the present invention will be disclosed in more detail with reference to FIG. 2.

Another function carried out by the present invention is the observing or reading out of the logic state of the output of a selected function module. In a presently preferred embodiment, to select a function module 12 for observation, a row-select (RSEL) signal is presented on the one of a plurality of row-select lines associated with the row in the array from which the output data is desired to be read. FIG. 1 illustrates RSEL₁ line 28 associated with the first row of the array, RSEL₂ line 30 associated with the second row in the array, and RSEL₃ line 32 associated with the third row in the array. In the embodiment of FIG. 1, the same YSEL lines 22, 24, and 26 which are used to select a function module during control mode are used in the observe mode as output sense lines to observe the output of the function module.

When using the observability function, the selection of which column line YSEL to observe when the RSEL line associated with a particular row is active is made by using transistors 52, 54, and 56, which are connected between their respective column YSEL lines and a common sense line 58. Sense line 58 drives a sense amplifier and output buffer 60 which is connected to I/O pad 62.

Transistors 64, 66, and 68 are connected between transistors 52, 54, and 56, respectively, and ground. The gates of transistors 64, 66, and 68 are connected to YSEL lines 22, 24, and 26. Each of transistors 64, 66, and 68 senses (and inverts) the state of the YSEL line to which its gate is connected. The gates of transistors 52, 54, and 56 are connected to column-observe select lines 70, 72, and 74 which can be decoded by conventional circuitry such as one-of-n decoders or shift registers. If one of transistors 52, 54, and 56 is turned on, the inverted state of the YSEL line with which it is associated will be presented at I/O pad 62.

As will be appreciated by those of ordinary skill in the art, P-channel current source transistor 76 is shown connected to each YSEL line and acts as a well-known pullup load to maintain a high logic level on the line in the absence of action by one of the devices connected to the line which would pull it to a low logic level.

Figure 2:
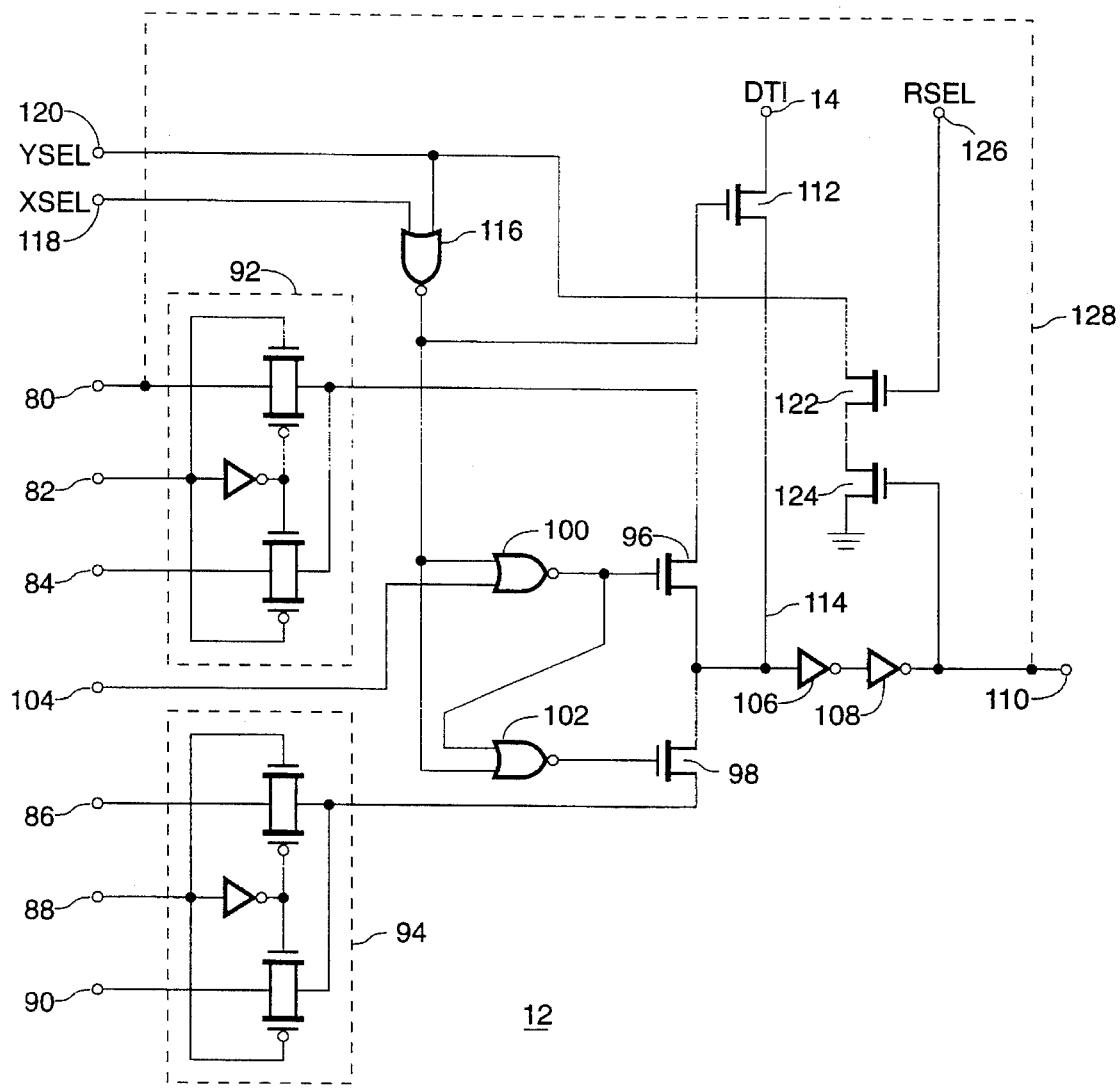
FIG. 2 is a schematic diagram of circuitry for use in an individual function circuit module for carrying out the present invention according to the first embodiment of the present invention.

The operation of the control and observe modes of the circuits of the present invention illustrated herein may be understood in more detail with reference to FIG. 2. Referring now to FIG. 2, a schematic of a portion of a typical function module circuit 12, with which the present invention may be used, is shown containing the additional circuitry necessary to implement the present invention as described in FIG. 1. Each functional module includes module inputs 80, 82, 84, 86, 88, and 90 which drive multiplexers 92 and 94. The output from either multiplexer 92 or 94 is selected using transistors 96 and 98, driven by NOR gates 100 and 102. One input of NOR gate 100 is driven by module input-104. Output buffers 106 and 108 are used as is known in the art. The output of function module 12 appears at node 110. The operation of function modules like the one thus far described with reference to FIG. 2 may be better understood with reference to U.S. Pat. Nos. 4,758,745 to El Gamal et al., and 4,910,417 to El Gamal et al. Those of ordinary skill in the art will immediately recognize that the function module described herein is merely illustrative of one environment into which the present invention may be placed, and that the invention is not limited to use with the illustrative function module shown in FIG. 2.

For purposes of the present invention, additional components are added to function module 12. In a presently preferred embodiment of the invention, a transistor switch 112 is connected between DTI line 14 and an existing internal node 114 inside function module 12. Internal node 114 functions as a data test input node for the function module 12, and transistor 112 serves as a means to place the signal from DTI line 14 into the function module circuitry. The gate of transistor 112 is driven from the output of NOR gate 116. NOR gate 116 is driven from the XSEL and YSEL lines 118 and 120 which together select the particular function module 12 to be controlled. The output of NOR gate 116 is high whenever the XSEL and YSEL lines 118 and 120 are simultaneously low. The output of NOR gate 116 drives the other input of NOR gate 100.

When the output of NOR gate 116 is high, the outputs of NOR gates 100 and 102 are low, thus turning off transistors 96 and 98 to isolate node 114 from the input portion of function module 12. Since the output of NOR gate 116 is also connected to the gate of transistor 112, the same action which isolates the input section of function module 12 from node 114 also connects the data test input line 14 to node 114, thus placing the data test bit then present on that line on node 114 and also on output node 110 of function module 12 through output buffers 106 and 108.

Two output read transistors 122 and 124 are connected in series between YSEL line 120 and ground. These transistors are used during the observe mode of the present invention. The gate of the first output read transistor 122 is connected to RSEL line 126. The gate of second output read transistor 124 is connected to output node 110 of function module 12.

When RSEL line 126 is high, indicating selection of the observe mode, the complement of the state of the output node 110 of function module 12 is placed on YSEL line 120. Those of ordinary skill in the art will see that, if it is desired to place the non-inverted data of output node 110 of function module 12 on YSEL line 120, the gate of second output read transistor 124 should be connected to the node between inverting buffers 106 and 108 instead of to node 110.

If function module 12 has been configured as a sequential function, such as a latch, as shown by dashed line feedback connection 128 between output node 110 and input 80 of function module 12, the data placed onto internal node 114 will be latched into the function module and will remain there until other action is taken. Those of ordinary skill in the art will recognize that if the module 12 is not configured as a sequential module, the data test bit may not be retained.

Those of ordinary skill in the art will realize that controlling a function module by the placement of a selected data test bit at the output node 110 of function module 12 in the control mode of the present invention results in the placement of the same bit at all circuit nodes in the integrated circuit to which output node 110 is connected. Thus, it will be appreciated that apparatus and a method have been disclosed for placing a data test bit at any desired node (where a node is defined as the input or output of a selected function module) in the electronic circuit which is implemented by the integrated circuit containing the present invention.

The real benefit of the control operation is obtained when it is applied to a function module which is configured as a sequential element, latch, or flip-flop stage. The control function is applied to this function module as described above when it is in its recirculate mode, i.e., feeding back its output value to its input and thereby latching and maintaining its data. After the stimulus data is loaded into the latch or flip-flop stage, the control mechanism may be deactivated and then used to control another latch stage or proceed with the observe function while the stimulus data is preserved in the latch. This is how auto test generation software works.

Any latch or flip-flop stage may be controlled by the above control scheme by selecting the appropriate control and test input signals as discussed above. As is well known in the art, controlling sequential elements is the key ingredient in any test scheme, since the sequential elements define all the various states of the circuit.

A number of commercial software vendors have presently-available products which can generate test vectors automatically for a particular circuit. All of these products require the capability to control sequential elements. The control scheme described herein will work well with such software products, which analyze the circuit and separate it generally into sequential and combinatorial paths.

Combinatorial paths are easily analyzed and vectors generated to test them. Combinatorial circuits which receive their input stimulus from input pads can easily be tested with test vectors. Combinatorial circuits which are buried deeper in the circuit need to obtain their input stimuli from sequential elements in the circuit as well as from primary circuit inputs. Testing such circuits thus depends on the present state of the circuit.

Using the control mode of the present invention, the appropriate state may be loaded into the circuit. The entire circuit may be tested by application of all the vectors needed using the combinatorial and sequential test stimuli until the test coverage of the circuit is complete. During application of any test vector cycle the outputs of the circuit elements may be observed and verified against expected circuit response. Using the observe mode of the present invention, internal circuit nodes, such as function module outputs not directly connected to output pads may be observed. It may be advantageous or necessary to observe internal nodes, particularly those associated with sequential elements during the test operation and compare them with expected results.

Those of ordinary skill in the art will recognize that the circuit shown in FIGS. 1 and 2 is capable of controlling and observing internal nodes of integrated circuits. However, it is apparent that only one node at a time may be observed. Such a system, while useful, would present a testing throughput problem in a real world application where large production volumes of integrated circuits having several hundred or thousand rows and columns of function modules must be tested.

Figure 3A:
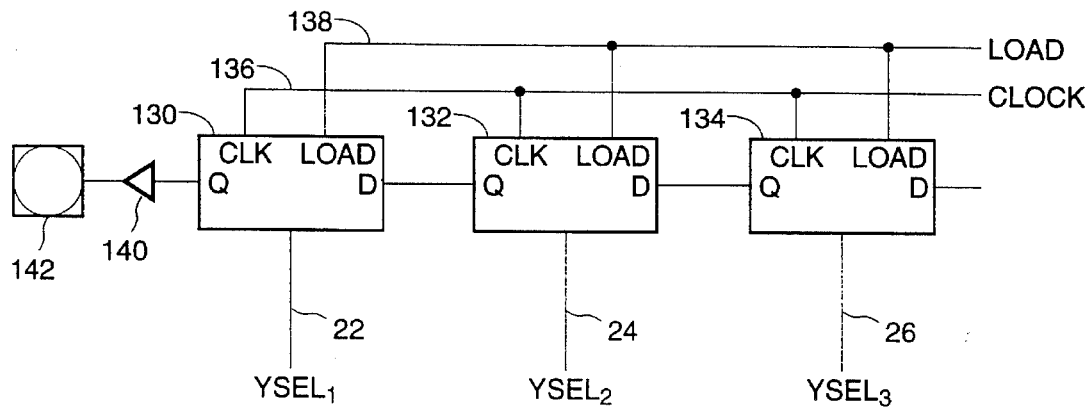
FIGS. 3a and 3b are block diagrams of alternative circuits for reading out the logic state on the outputs of selected function circuit modules according to the present invention.

FIG. 3a is a block diagram of circuitry useful with the present invention for supplying the results observed at a single point in time for a plurality of function modules. Referring to FIG. 3a, flip-flop circuits 130, 132, and 134, arranged as a parallel to serial converter register as is well known in the art, have data inputs connected to YSEL lines 22, 24, and 26, respectively, of array 10. They are daisy chained together and are driven from a common clock line 136. Clock line 136 may be driven from an external clock I/O pin on the integrated circuit, which may be selectively enabled by known methods during testing.

A common data load line 138 is used to load information from all YSEL lines to which the parallel to serial converter register is connected. Data load line 138 may be driven from an external signal at an I/O pin on the integrated circuit, which may be selectively enabled by known methods during testing.

After the loading of data into flip-flops 130, 132, and 134 from the YSEL lines, the clock line is activated and the data is clocked from the flip flops in serial form into output buffer 140 and to I/O pad 142. It is possible for the contents of an entire array to be shifted out one row at a time in this manner if necessary, thus providing a complete observation of the logic states of all nodes at the point in time that the latch command was given on data load line 138.

Figure 3B:
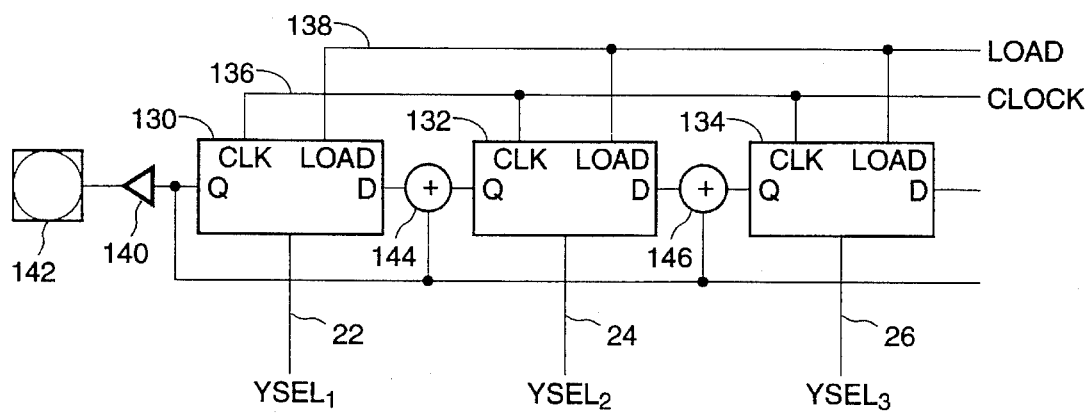

Another variation of the scheme shown in FIG. 3a is illustrated in FIG. 3b, in which the results register is configured as a linear feedback shift register. Using a linear feedback shift register results in compressing and encoding the test results in a unique compact signature that can be shifted out and compared with an expected signature after the test has been completed.

The technique illustrated in FIG. 3b further reduces overall circuit test times. The feedback connections in the linear feedback shift register are selected according to a mathematical polynomial so that when the test is completed the register contains a unique pattern which only occurs when the circuit is functioning properly. Linear feedback shift registers, and their use for these purposes, as well as selection of polynomials for use in the tests described, are within the scope of one of ordinary skill in the art.

Figure 4A:
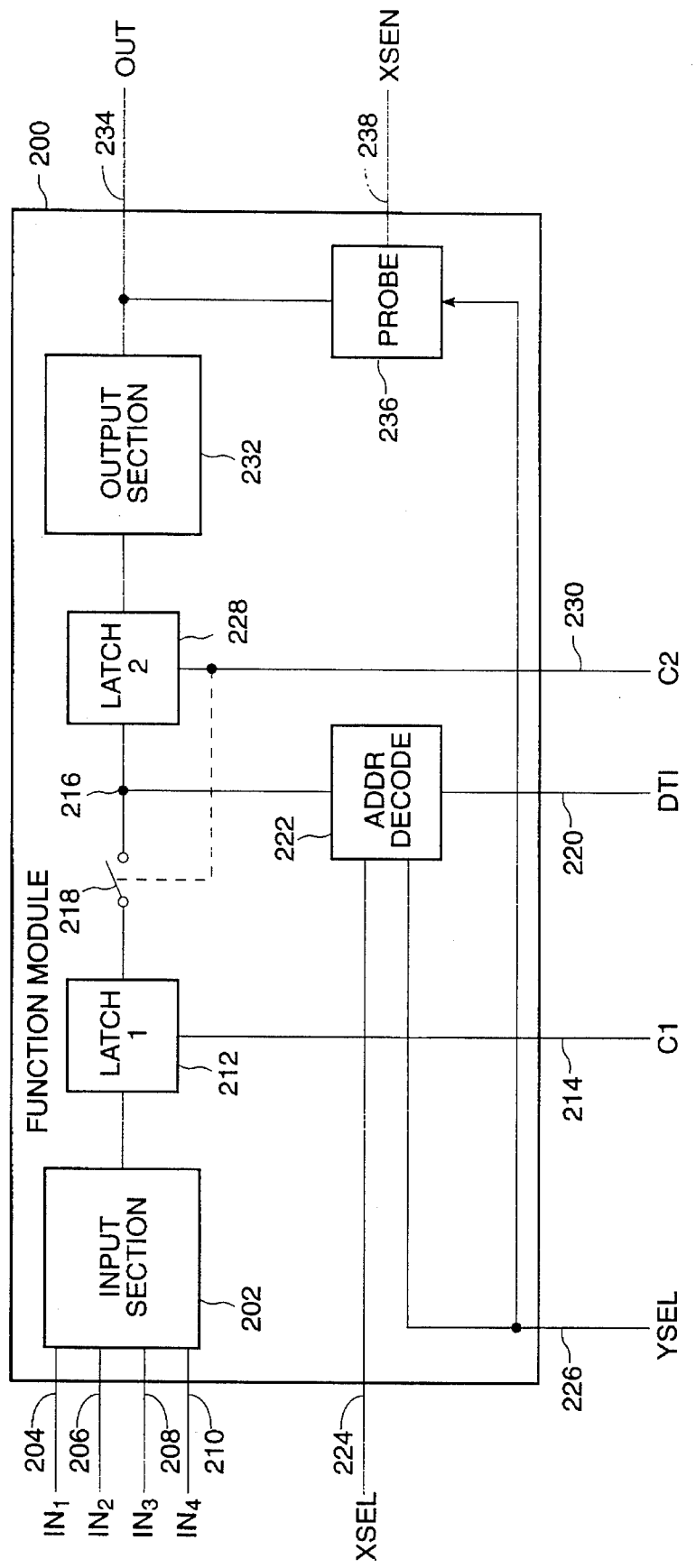
FIG. 4a is a block diagram of a circuit which may be used in an individual function circuit module for carrying out the present invention according to the second embodiment of the present invention.

Referring now to FIG. 4a, a block diagram of an embodiment of a circuit for carrying out a second aspect of the present invention is shown. The circuit shown in block diagram form in FIG. 4a allows 100% observability and 100% controllability of the function module.

A function module 200 includes an input section 202, which may perform, for example, combinatorial logic functions, sequential functions, or even analog functions. Input section 202 includes inputs $IN_1$, $IN_2$, $IN_3$, and $IN_4$, shown respectively at reference numerals 204, 206, 208, and 210. While four inputs are shown, those of ordinary skill in the art will recognize that the number of inputs will vary depending on the intended function of input section 202.

The output of input section 202 is connected to the input of first latch 212. First latch 212 may be one of a number of common data elements used to latch data, or, in the case of analog circuitry, may include a sample/hold amplifier or the like. First latch 212 is activated, as is known in the art, by a control input line 214 connected to a control signal C1. The output of first latch 212 is connected to an internal node 216 via a switch 218.

A data test input (DTI) line 220, connected to from a source of data test information shown as DTI, may be used to place data test information onto internal node 216 by activating address decoder 222 via its XSEL and YSEL lines 224 and 226, respectively.

Internal node 216 is connected to the input of a second latch 228. Like first latch 212, second latch 228 may be one of a number of common data elements used to latch data, or, in the case of analog circuitry, may include a sample/hold amplifier or the like. Second latch 228 is activated, as is known in the art, by a control input line 230 connected to a control signal C2. Control signal C2 may also be used to open switch 218 to disconnect input section 202 from output section 232 of function module 200 as will be disclosed herein.

The output of second latch 228 is connected to the input of output section 232. Output section 232 may include an output buffer, additional combinational or sequential logic or analog circuitry, or may simply be a direct connection, depending on the function of function module 200 and whether the output of second latch 228 is itself buffered. The output of output section 232 is connected to at least one output lead 234 of function module 200.

First and second latches 212 and 228 may be configured as pass-through devices when their control inputs C1 and C2 are unactivated. When so configured, the operation of function module 200 is unaffected by the presence of the circuitry of the present invention.

Probe circuitry 236 is connected to output line 234 of function module 200 and serves to route the output value obtained from function module 200 to external diagnostic circuitry. In the embodiment shown in FIG. 4a, the probe circuit 236 is activated by YSEL line 226, although those of ordinary skill in the art will recognize that other schemes could be utilized.

Probe circuit 236 may be used to provide 100% observability of the outputs of all function modules 200 in an integrated circuit array. The output value for function module 200 appears as an output of probe circuit 236 on XSEN line 238. In an actual embodiment fabricated as a part of an integrated circuit, there will be a plurality of XSEN lines and a number of function modules 200 will be connected to each XSEN line. When a particular YSEL line is activated, all probe circuits 236 associated with function modules 200 connected to that YSEL line will pass the values present on the outputs of their respective function modules to their respective XSEN lines. Circuits like those disclosed in FIGS. 3a and 3b may then be used to carry the data values off chip for analysis.

The circuit of FIG. 4a may be used to provide 100% controllability of the function module 200. This circuit may also be used to retain the output state of input section 202 for diagnostic purposes.

The output 234 of function block 200 may be controlled by disconnecting output section 232 from input section 202 and placing a value from DTI input line 220 onto internal node 216 and latching it into second latch 228. Function module 200 is selected for control by activating its XSEL and YSEL lines 224 and 226, thus passing the data value from DTI line 220 through address decoder 222 onto node 216. C2 input 230 is activated, latching the data test value into second latch 228, and switch 218 (connected to C2 line 230) opens, disconnecting input section 202 from internal node 216 and output section 232.

The data test value latched into second latch 228 appears at output 234 of module 200 and will remain there until second latch 228 is released or reloaded. It can be seen that this action allows the data test value to be retained indefinitely at the output 234 of function module 200.

The value appearing at the output of input section 202 of function module 200 as a result of particular data values placed on inputs 204, 206, 208, and 210 may be retained indefinitely in function module 200 by latching it into first latch 212 by using control line 214 (C1). Once new data has been loaded into first latch 212 by activating C1, this data may be latched into second latch 228 by activating C2. This enables observation of the new data.

Figure 4B:
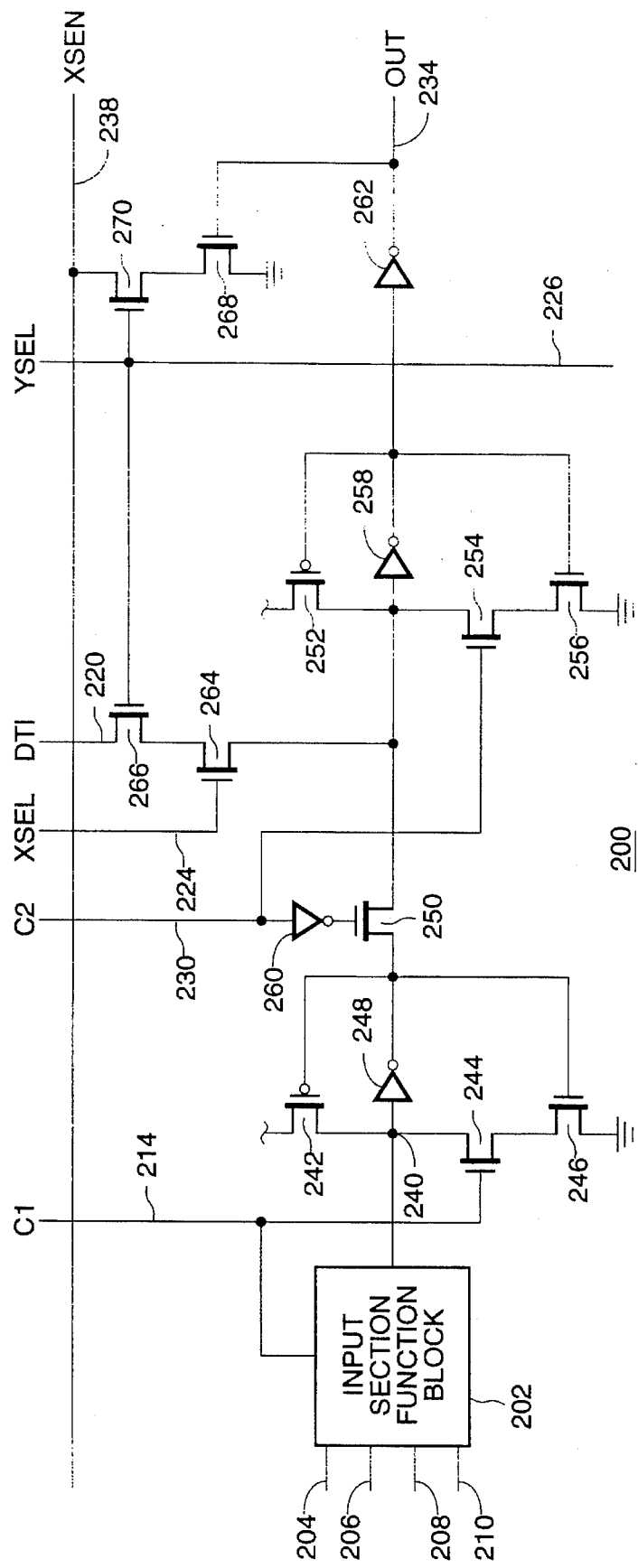

Referring now to FIG. 4b, illustrative circuitry for implementing the block diagram circuit of FIG. 4a is shown. Where like elements are shown, the reference numerals in FIGS. 4a and 4b are the same. In the embodiment of FIG. 4b, data test bit retention is provided for a logic array integrated circuit. Data test bit retention allows placement and retention of a selected data test bit at the output node of a function circuit module regardless of whether that circuit is configured as a combinatorial or sequential circuit.

A function circuit module 200 according to this aspect of the present invention may include input section function block 202, having inputs 204 and 206, 208, and 210. Only four inputs are shown for the purposes of illustrating the principles of the present invention, but those of ordinary skill in the art will recognize that particular design considerations will dictate how many inputs such a function block actually has. For example, function block 202 may include combinatorial logic, such as is disclosed in the embodiment of FIG. 2, or may include other circuits.

The output of function block 202 is connected to a node 240 internal to the function module. A first latch comprising P-channel transistor 242, N-channel transistors 244 and 246 and inverter 248 has its input connected to node 240. The gate of N-channel transistor 244 is connected to a control line C1 214. Control line C1 214 is also connected to input section function block 202 and acts to isolate the output of function block 202 at node 240 from its input.

During normal operation of the integrated circuit containing functional circuit module 200, control line 214 C1 is held low. This action connects function block 202 to node 240 in one of numerous well known ways (e.g., as described above), and also configures the first latch as a pass through by turning off N-channel transistor 244.

An N-channel transistor 250 is connected between the output of the first latch and the input of a second latch comprising P-channel transistor 252, N-channel transistors 254 and 256, and inverter 258. The gate of N-channel transistor 254 is connected to a control line C2 230 Control line C2 230 is also connected to the gate of N-channel transistor 250 through inverter 260. The output of the second latch is connected to output node 234 through inverter buffer 262.

During normal operation of the integrated circuit of which functional circuit module 200 is a part, control line C2 230 is held low. This action turns on N-channel transistor 250, connecting the output of the first latch to the input of the second latch, and configures the second latch as a pass through by turning off N-channel transistor 254.

Two N-channel transistors 264 and 266 are connected in series between the input to the second latch and a DTI (data test input) line 220. The gate of N-channel transistor 264 is connected to an XSEL line 224. The gate of N-channel transistor 266 is connected to a YSEL line 226. During normal circuit operation, XSEL line 224 and YSEL line 226 are held low and transistors 264 and 266 are turned off. Data on DTI line 220 is thus inhibited from entering the module 200.

Two N-channel transistors 268 and 270 are connected between a fixed voltage, such as ground, and an XSEN line 238. The gate of N-channel transistor 268 is connected to output node 234 of functional circuit module 200 and the gate of N-channel transistor 270 is connected to YSEL line 226. During normal circuit operation, N-channel transistor 270 is off because YSEL line 226 is held low.

The functions of the present invention are carried out using control lines 214 (C1), 230 (C2), DTI line 220, XSEL line 224, YSEL line 226 and XSEN line 238.

The output state of the circuit shown in FIG. 4b may be easily observed by raising YSEL line 226. The logic state of output node 234 will appear inverted on XSEN line 238 because of the action of N-channel transistors 268 and 270. If both output node 234 and YSEL line 226 are high, XSEN line 238 will be pulled to ground. If YSEL line 226 is high but output node 234 is low, XSEN line 238 will remain high. A small pullup device may be connected to XSEN line 238 to supply enough current to keep its voltage at a logic high state. As in the embodiment of FIGS. 1 and 2, all of the XSEL lines and YSEL lines in an integrated circuit containing the present invention may be controlled by peripheral circuits in a manner well known in the art.

By using the circuit of FIG. 4b, output node 234 can be controlled. Control line C2 230 is brought high, turning off N-channel transistor 250 and disconnecting the input section function block 202 and first latch from the second latch and output node 234. A selected logic level may then be placed on the input of the second latch by raising XSEL line 224 and YSEL line 226 to a high voltage and placing the desired logic level on DTI line 220. Because control line C2 230 has turned on N-channel transistor 254 in the second latch, whatever logic level appears on DTI line 220 will be latched at the output of the second latch and will appear uninverted at output node 234.

Those of ordinary skill in the art will appreciate that output node 234 will remain latched with the previous data test bit until either transistors 264 and 266 are turned on again and a new data test bit is presented at DTI input line 220, or line 230 (C2) is brought low, turning on transistor 250, turning off transistor 254, reconnecting the first latch to the second latch through transistor 250.

Similarly, the output logic state of function block 202 may be latched at the output of the first latch. Control line 214 is raised high to turn on N-channel transistor 244, simultaneously disconnecting the input section function block from node 240, resulting in the latching of the logic state which was present in input section function block 202.

Those of ordinary skill in the art will recognize the degree of control over the internal circuit nodes in an integrated circuit which use of the present invention allows. By combining control of the output states of the output nodes of all functional circuit modules 200 in an integrated circuit and the further ability to hold selected logic states of function blocks 202 with the ability to observe the output of each functional circuit module 200 in an integrated circuit, a powerful diagnostic tool is provided to the designer.

The embodiment of FIG. 4b can be made to operate like the embodiment of FIGS. 1 and 2 by holding control line 214 (C1) low at all times and only raising control line 230 (C2) when test data on DTI line 220 is being introduced through transistors 264 and 266.

Figure 5:
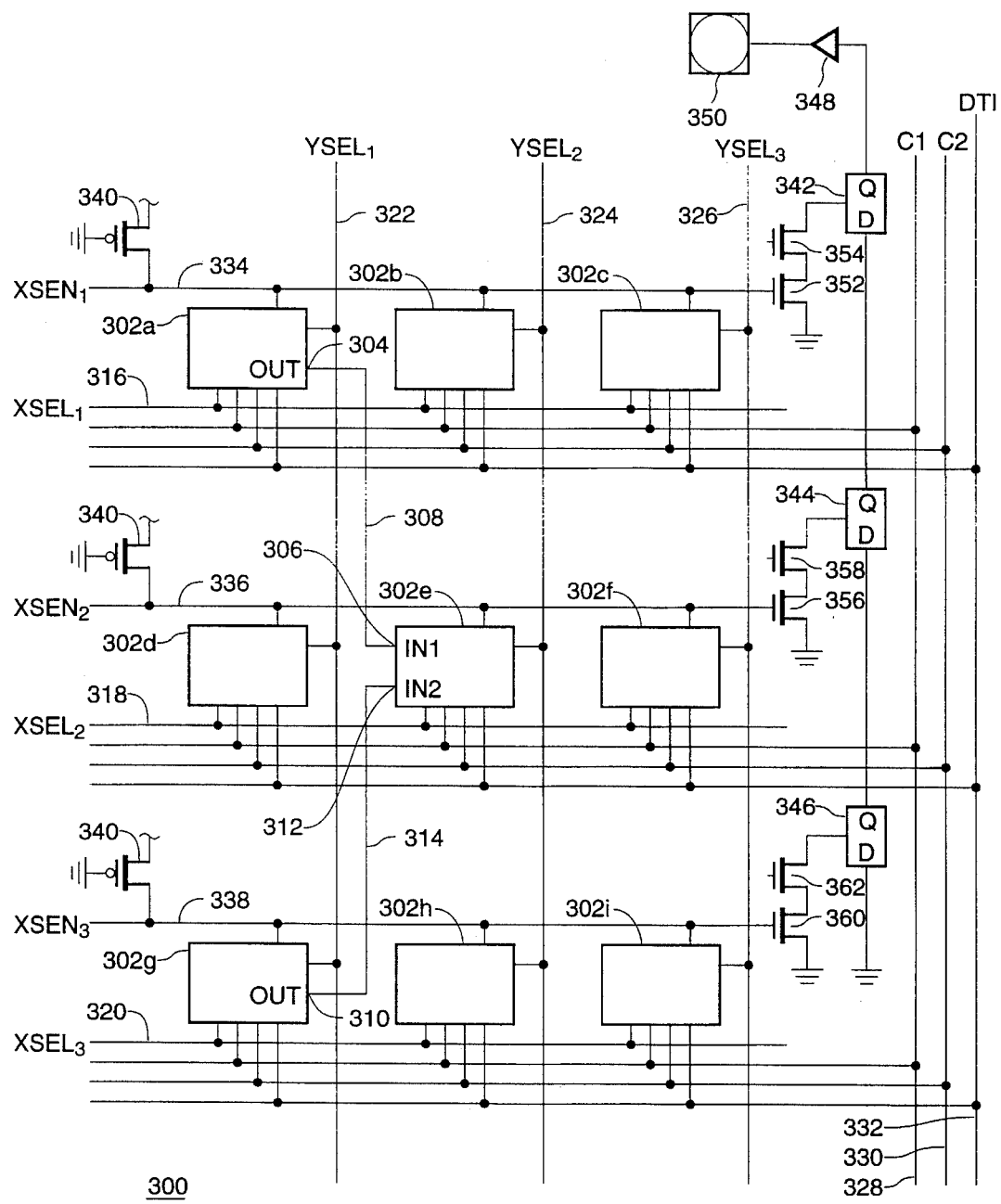
FIG. 5 is a block diagram illustrating the controllability and observability features of the second embodiment of the present invention disclosed herein.

FIG. 5 is a block diagram of circuitry according to the present invention and illustrates by example the 100% controllability feature of the present invention. An array 300 of logic function circuit modules 302a–302i, which may be conceptually arranged as a plurality of rows and columns, wherein modules 302a, 302b, and 302c form a first row; modules 302d, 302e, and 302f form a second row; and modules 302g, 302h, and 302i form a third row. Similarly, modules 302a, 302d, and 302g form a first column; modules 302b, 302e, and 302h form a second column; and modules 302c, 302f, and 302i form a third column. As with the other logic function circuit modules illustrated herein, logic function circuit modules 302a–302i may be configured from a wide variety of circuits. The size of the array depicted in FIG. 5 is illustrative only for the purposes of illustrating the invention and, from the disclosure herein, those of ordinary skill in the art will understand how to construct an array of any size.

Each of logic function circuit modules 302a–302i will have a plurality of inputs (two are shown for purposes of illustration) and at least one output for use in performing the functions assigned to the module and the overall circuit of which it is a part. Those of ordinary skill in the art will readily appreciate that the overall circuit is realized by the use of interconnections between the inputs and the outputs of the logic function circuit modules utilized as circuit components. These interconnections may be made using mask-defined metal layers or by any technique for establishing user-defined interconnections.

In the particular circuit example shown in FIG. 5, output 304 of module 302a, is shown connected to first input 306 of module 302e via interconnect line 308. Similarly, output 310 of module 302g is shown connected to second input 312 of module 302e via interconnect line 314. Those of ordinary skill in the art will realize that any combination of desired interconnects may be implemented, depending on the circuit function desired and the internal makeup of modules 302a–302i.

As shown in FIG. 5, $XSEL_1$–$XSEL_3$ lines, shown at reference numerals 316, 318, and 320, respectively, and $YSEL_1$–$YSEL_3$ lines, shown at reference numerals 322, 324, and 326, respectively, may be used to select one or more modules for control or observation in the manner disclosed herein with respect to FIGS. 3 and 4. Lines C1 (shown at reference numeral 328) and C2 (shown at reference numeral 330) are global control lines for the first and second latches of the function modules as described previously with reference to FIG. 4. DTI line 332 is also a global data test input line for all of the modules, and is used to place selected data test bits into selected modules. XSEN lines $XSEN_1$–$XSEN_3$, shown at reference numerals 334, 336, and 338, respectively, are sense lines for reading out the logic state at the output nodes of selected modules and may be connected to transistors 340, which act as well-known pullup loads.

Loadable flip-flops 342, 344, and 346 are connected as a serial shift register and are used to transport the test data from the XSEN lines 334, 336, and 338 through buffer 348 to I/O pad 350 for observation and evaluation as is shown in FIG. 3a, although those of ordinary skill will recognize that other configurations, such as that of FIG. 3b or other similarly functioning circuits, could also be utilized.

A transistor pair is used to place output test data bits from the modules into each of flip-flops 342, 344, and 346. Transistor 352 has its gate connected to $XSEN_1$ line 334, its source connected to ground, and its drain connected to the source of transistor 354. The drain of transistor 354 is connected to the data load input of flip-flop 342. Similarly, transistor 356 has its gate connected to $XSEN_2$ line 336, its source connected to ground, and its drain connected to the source of transistor 358. The drain of transistor 358 is connected to the data load input of flip-flop 344. Similarly, transistor 360 has its gate connected to $XSEN_3$ line 338, its source connected to ground, and its drain connected to the source of transistor 362. The drain of transistor 362 is connected to the data load input of flip-flop 346. The gates of transistors 354, 358, and 362 may be connected to decoding control lines which can be driven using conventional decoding circuitry, such as shift registers or one-of-n decoders.

As an example of the operation of the present invention, it may be used to verify the functionality of module 302e. First, the outputs of modules 302a, and 302g are controlled to place desired test data bits at the first and second inputs of module 302e, and then the output of module 302e is observed.

To control the outputs of modules 302a, and 302g, C2 line 330 is first brought high, enabling the second latch for all function modules in the array. Module 302a, may then be selected by bringing $XSEL_1$ line 316 and $YSEL_2$ line 322 high. The selected data test bit appearing on DTI line 332 will be latched and retained at the output of module 302a. Module 302g may then be selected by bringing $XSEL_3$ line 320 and $YSEL_1$ line 322 high. The selected data test bit appearing on DTI line 332 will be latched and retained at the output of module 302g. If identical test bits are to be loaded into modules 302a, and 302g, this may be accomplished by simultaneously bringing the $XSEL_1$ line 316, $XSEL_3$ line 320, and $YSEL_1$ line 322 high.

After completion of the control operation, C2 line 330 remains high and C1 line 328 is brought high to enable the first latch in all of the function modules in the array. When the C1 line 328 is brought high, the new logic state of module 302e is latched into its first latch. C2 line 330 is then brought low to transfer the new logic state to the output of module 302e. Module 302e may then be selected for observation by bringing $YSEL_2$ line 324 high, placing the inverted logic state of the output of module 302e on the $XSEN_2$ line 336. The gate of transistor 358 is turned on and the output test data is loaded into flip-flop 344 and clocked out through buffer 348 to I/O pad 350.

Multiple node control allows the setting up (control) of the output nodes of more than one function circuit module which are connected to the inputs of another function circuit module, thus allowing the control of the several inputs of a single function circuit module. This feature adds versatility to control-observe testing of function modules in a logic array integrated circuit.

Those of ordinary skill in the art will recognize that the embodiments shown and described herein are illustrative only and that the scope of the invention is not to be limited to the particular embodiments shown and described in the figures and accompanying written disclosure herein. Preferred embodiments of the present invention have been shown and described herein, but from this disclosure, those of ordinary skill in the art will readily be able to comprehend and conceive other embodiments which are variations from the above disclosed embodiments. Such embodiments are meant to fall within the scope of the present invention which is to be limited only by the appended claims.

What is claimed is:

1. In an integrated circuit including a plurality of function circuit modules, each of said function circuit modules having a defined function which need not be the same as the defined function of other ones of said function circuit modules, each of said function circuit modules having inputs and at least one data output, said at least one data output of at least some of said function circuit modules hardwired to at least one of said inputs of another of said function circuit modules, each of said function circuit modules further including:

control means contained within said integrated circuit, responsive to first addressing signals, for directly forcing the data output of any one of said plurality of function circuit modules to assume a selected logic state, said control means being independent of the defined function of and interconnection between said function circuit modules;

observe means contained within said integrated circuit, responsive to second addressing signals, for directly observing the data output of any selected one of said function circuit modules at a single I/O pin of said integrated circuit;

said control means and said observe means being simultaneously operable.

2. In an integrated circuit including a plurality of function circuit modules, each of said function circuit modules having a define function which need not be the same as the defined function of other ones of said function circuit modules, each of said function circuit modules having inputs and at least one data output, said at least one data output of at least some of said function circuit modules hardwired to at least one of said inputs of another of said function circuit modules, a circuit for providing 100% controllability and observability of said outputs of each of said function circuit modules including:

select means for selecting any one of said function circuit modules;

control means associated with each of said function circuit modules and responsive to said select means, for directly forcing the data output of any of said function circuit modules to assume a selected logic state, said control means being independent of the defined function of and interconnection between said function circuit modules; and observe means associated with each of said function circuit modules and responsive to said select means, for directly reading the data output of any of said function circuit modules at a single I/O pin of said integrated circuit.

3. In an integrated circuit including a plurality of function circuit modules, each of said function circuit modules having a defined function which need not be the same as the defined function of other ones of said function circuit modules, each of said function circuit modules having inputs and at least one data output, said at least one data output of at least some of said function circuit modules hardwired to at least one of said inputs of another of said function circuit modules, a circuit for providing 100% controllability of said outputs of each of said function circuit modules including:

a test data input node in each of said function circuit modules in said integrated circuit;

addressing means for selecting any one of said function circuit modules;

test data path means, directly communicating between an input/output pin of said integrated circuit and each of said test data input nodes of said function circuit modules, for providing a user-selectable logic level present at said input/output pin directly to said test data input nodes of each of said function circuit modules; and control means for directly forcing the data output of the one of said function modules selected by said addressing means to assume a logic state related to said test data, said control means being independent of the defined function of and interconnection between said function circuit modules.

4. In an integrated circuit including a plurality of function circuit modules, each of said function circuit modules having a defined function which need not be the same as the defined function of other ones of said function circuit modules, each of said function circuit modules having inputs and at least one data output, said at least one data output of at least some of said function circuit modules hardwired to at least one of said inputs of another of said function circuit modules, a circuit for providing 100% controllability and 100% observability of said data outputs of each of said function circuit modules including:

a test data input node in each of said function circuit modules contained in said integrated circuit;

addressing means for selecting any one of said function circuit modules;

test data path means, directly communicating between an input/output pin of said integrated circuit and said test data input nodes of each of said function circuit modules, for providing a user-selectable logic level present at said input/output pin directly to said test data input nodes of each of said function circuit modules;

means for directly forcing the data output of the one of said function modules selected by said addressing means to assume an output state related to said test data, and control means for reading the output state of the one of said function circuit modules selected by said addressing means directly to an input/output pin of said integrated circuit, said control means being independent of the defined function of and interconnection between said function circuit modules.

5. In an integrated circuit including a plurality of function circuit modules, each of said function circuit modules having a defined function which need not be the same as the defined function of other ones of said function circuit modules, each of said function circuit modules having inputs and at least one data output, said at least one data output of at least some of said function circuit modules hardwired to at least one of said inputs of another of said function circuit modules, a circuit for providing 100% controllability of the outputs of each of said function circuit modules including:

means associated with each one of said function circuit modules for isolating its output from its inputs; and means for latching a user-selectable logic level at the data output of each of said function circuit modules.

6. An integrated circuit including:

an array of identical logic function circuits which may be mask programmed to perform any one of a plurality of combinatorial and sequential logic functions, each of said logic function circuits having inputs and at least one output, said integrated circuit configured to mask programmably connect said logic function circuits to each other in a random fashion;

logic state input means, directly coupled between an input/output pin on said integrated circuit and a test data input node in each of said logic function circuits, for presenting a user-selectable logic state to each one of said logic function circuits;

latching means in each one of said logic function circuits, coupled to said test data input nodes thereof and responsive to a latching signal, for latching said user-selectable logic state into its logic function circuit;

selection means, coupled to each of said logic function circuits and responsive to signals from off of said integrated circuit, for providing said latching signal to any one of said logic function circuits; and means for selectively driving said output of each of said logic function circuits to a logic state related to said user-selectable logic state stored in said latching means;

whereby each of said logic function circuits may be individually and directly controlled.

* * * * *

UNITED STATES PATENT AND TRADEMARK OFFICE
CERTIFICATE OF CORRECTION

PATENT NO. : 5,528,600
DATED : June 18, 1996
INVENTOR(S) : Khaled El Ayat; King W. Chan; Theodore M. Speers It is certified that error appears in the above-indentified patent and that said Letters Patent is hereby corrected as shown below:

On Column 13, line 24, replace "$YSEL_2$" with --$YSEL_1$--.

On Column 14, line 26, replace "define" with --defined--.

Signed and Sealed this

Third Day of December, 1996

Attest:

BRUCE LEHMAN

*Attesting Officer*  *Commissioner of Patents and Trademarks*